United States Patent [19]

Miwada

[11] Patent Number: 5,703,640
[45] Date of Patent: Dec. 30, 1997

[54] COLOR LINEAR IMAGE SENSOR HAVING A REDUCED DISTANCE BETWEEN PHOTOSENSOR ARRAYS

[75] Inventor: Kazuo Miwada, Tokyo, Japan

[73] Assignee: NEC Corporation, Tokyo, Japan

[21] Appl. No.: 739,041

[22] Filed: Oct. 28, 1996

Related U.S. Application Data

[63] Continuation of Ser. No. 534,307, Sep. 27, 1995, Pat. No. 5,631,702, which is a continuation of Ser. No. 184,929, Jan. 24, 1994, abandoned.

[30] Foreign Application Priority Data

Jan. 22, 1993 [JP] Japan ............................ 5-8727

[51] Int. Cl.$^6$ ..................................... H04N 3/14
[52] U.S. Cl. ............... 348/272; 348/311; 348/315; 348/322; 257/232; 257/440; 358/483
[58] Field of Search ..................... 348/272, 273, 348/274, 275, 276, 277, 278, 279, 280, 281, 282, 283, 311, 315, 322; 257/231, 232, 233, 234, 241, 440, 443; 358/483; 250/208.1

[56] References Cited

U.S. PATENT DOCUMENTS

| | | | |
|---|---|---|---|
| 4,689,687 | 8/1987 | Koike et al. | 348/322 |
| 4,847,692 | 7/1989 | Tabei | 348/315 |

*Primary Examiner*—Andrew Faile
*Assistant Examiner*—Andrew B. Christensen
*Attorney, Agent, or Firm*—Sughrue, Mion, Zinn, Macpeak & Seas, PLLC

[57] ABSTRACT

A color linear image sensor apparatus includes a wiring conductor formed of a first level polysilicon film which is provided on a channel stopper in photocell arrays and which is connected to a first transfer gate electrode of a CCD register. The first transfer gate electrode is also connected to a second transfer gate electrode through a contact hole. Thus, even if the wiring conductor is formed on the channel stopper in the photocell array, a dead zone for locating a wiring conductor for the driving clocks becomes unnecessary, and accordingly, the distance between photocell arrays can be shortened to two thirds to a half of the distance in the conventional examples.

2 Claims, 10 Drawing Sheets

- 501 SUBJECT COPY SURFACE
- 502 LENS
- SUBJECT COPY DISPLACEMENT DIRECTION
- 503 FOCUSED PLANE OF COLOR IMAGE SENSOR

COLOR LINEAR IMAGE SENSOR HAVING A REDUCED DISTANCE BETWEEN PHOTOSENSOR ARRAYS

This is a continuation of application Ser. No. 08/534,307, filed Sep. 27, 1995, now U.S. Pat. No. 5,631,702 which is a Continuation of Ser. No. 08/184,929 filed Jan. 24, 1994 now abandoned.

BACKGROUND OF THE INVENTION

1. Field of the Invention

The present invention relates to a color linear image sensor apparatus, and more specifically to a color linear image sensor apparatus comprising three arrays of photosensor cells.

2. Description of Related Art

Referring to FIG. 1, there is shown one conventional color linear image sensor apparatus comprising three arrays of photosensor cells. This conventional color linear image sensor apparatus includes three arrays 1R, 1G and 1B of photoelectric conversion cells, namely, photocells, and a CCD register 2R-1, 2R-2, ... located at each side of each of these photocell arrays 1R, 1G and 1B. In this example, these photocell arrays 1R, 1G and 1B have a peak sensitivity in red, in green and in blue, respectively, so that the apparatus functions as a color linear image sensor. With this arrangement, since the three linear image sensors are located in parallel, a distance "L" between each pair of adjacent photocell arrays is ordinarily required to be on the order of 100 µm to 200 µm.

Because of this distance "L" between each pair of adjacent photocell arrays, each of the photocell arrays senses a different position on the same subject copy, as will be apparent from FIG. 3 illustrating an optical path diagram in the case of using the color linear image sensor apparatus. On the other hand, a color signal processing needs a color signal for red, a color signal for green and a color signal for blue on the same position. Because of the difference between the positions sensed by the photocell arrays, it was necessary to externally store the color signals of the amount in proportion to the distances "L" between the photocell arrays. For example, assuming that the distance "L" between each pair of adjacent photocell arrays is 140 µm, a size "d" of each photocell is 14 µm, and a signal for each one pixel has information of 10 bits, a memory capacity "$M_1$" required for each one pixel is expressed as follows:

$$M_1 = 10 \ (L+2L)/d = 300 \ (bits)$$

Furthermore, assuming that one line is composed for example 5,000 pixels, a memory capacity "$M_T$" required for processing the color signals for one line is expressed as follows:

$$M_T = M_1 \times 5000 = 1.5 \ (megabits)$$

In general, a memory for this purpose is required to have a high speed reading operation; therefore, an expensive memory such as a static random access memory (SRAM) has been used. Accordingly, there is a demand for a color linear image sensor apparatus having a shortened distance "L" between adjacent photocell arrays, so that a required external memory capacity can be made small.

In the above mentioned conventional color linear image sensor apparatus, as will be understood from FIG. 1, there is restriction in shortening the distance between adjacent photocell arrays, because there are wiring conductors for clocks $\phi_1$ and $\phi_2$ between the CCD register 2R-2 and the CCD register 2G-1.

For example, referring to FIG. 2, there is shown an enlarged layout pattern diagram of a portion "A" in FIG. 1.

In FIG. 2, the CCD register 2R-2 and the CCD register 2G-1 are located between two photocell arrays 1R and 1G, each of which is formed by arranging a number of photodiodes PD (isolated from each other by a channel stopper 6) in a single line. The CCD register 2R-2 and the CCD register 2G-1 have first transfer gate electrodes 11-1 (formed of a first level polysilicon film) and a second transfer gate electrodes 11-2 (formed of a second level polysilicon film), which are common to the CCD register 2R-2 and the CCD register 2G-1. The CCD register 2R-2 and the CCD register 2G-1 are isolated from each other by a channel stopper 6A. Between the photocell array 1R and the CCD register 2R-2, there is formed a transfer gate electrode 12-2 (3R-2) of the second level polysilicon film, and similarly, between the photocell array 1G and the CCD register 2G-1, there is formed a transfer gate electrode 12-1 (3G-1) of the second level polysilicon film. Clock signal wiring conductors 14($\phi_1$) and 14($\phi_2$), which also function as a light shield, are connected to the first transfer gate electrode 11-1 and the second transfer gate electrode 11-2 through contact holes C1 and C2, respectively.

This arrangement was attributable to an idea of forming the clock signal wiring conductors 14(($\phi_1$) and 14($\phi_2$) above the CCD registers. Nevertheless, the channel stopper 6A was required to have a sufficient width to form the contact holes C1 and C2 which connect the clock signal wiring conductors to the first and second gate electrodes, respectively. For example, in the case of designing the layout pattern under the 2 µm rule, assuming that the size of the contact holes is 2 µm×3 µm and the alignment margin is 1 µm, the channel stopper 6A is required to have the width of at least 10 µm, and preferably about 12 µm. In this connection, only for the purpose of electrical isolation of the transfer channels, it is sufficient if this width of the channel stopper is at least 2 µm. Therefore, even if the above mentioned design is adopted, the existence of the clock signal wiring conductors is still hindrance in shortening the distance "L" between the photocell arrays.

Furthermore, as one method for shortening the distance "L" between the photocell arrays, it might be possible, as shown in FIG. 4, to connect the gate electrodes (11-1A, 11-2A, ... ) of the CCD register 2 on the channel stopper 6 of the photocell array 1, as adopted in an area image sensor. However, this method requires four-phase, tri-level, pulses $\phi_1$, $\phi_2$, $\phi_3$ and $\phi_4$ for driving the CCD registers, and therefore, the driving condition becomes complicated.

SUMMARY OF THE INVENTION

Accordingly, it is an object of the present invention to provide a color linear image sensor apparatus which has overcome the above mentioned defects of the conventional ones.

Another object of the present invention is to provide a color linear image sensor apparatus which has a wiring conductor on a channel stopper of a photocell array and which can adopt a two-phase driving method which is the simplest driving method for the CCD register.

The above and other objects of the present invention are achieved in accordance with the present invention by a color linear image sensor apparatus including three linear image sensors which are integrated in parallel to each other on the same semiconductor chip and which have a color sensitivity different from each other, each of the linear image sensors including a photocell array composed of a plurality of photocells arranged in the form of a single array, and a CCD register receiving an electric charge form the photocell array and transferring the received electric charge therethrough, the CCD register being composed of a plurality of alternately located first and second transfer gate electrodes, characterized in that it comprises a wiring conductor formed through an insulating film on a channel stopper which isolates adjacent photocells of each of the linear image sensors from each other, the wiring conductor interconnecting the mutually corresponding first transfer gate electrodes of the three linear image sensors, the wiring conductor being formed of a conducting film of the same level as that of the first transfer gate electrode, and means for connecting each of the second transfer gate electrodes of each of the linear image sensors, to a corresponding first transfer gate electrode that is paired with the each second transfer gate electrode.

With the above mentioned arrangement, since the clock signal wiring conductor for driving the CCD register is no longer required to traverse the area between the photocell arrays, it is possible to shorten the distance between the photocell arrays.

In the dual channel type in which a first CCD register is arranged at one side of the photocell array and a second CCD register is arranged at the other side of the same photocell array and in each of the first and second CCD registers, first and second transfer gate electrodes are provided for each one of the photocells, the mutually corresponding first transfer gate electrodes of the first and second CCD registers are connected by one wiring conductor formed on each channel stopper region in each photocell array, so that a driving pulse can be applied to the transfer gate electrodes.

In the single channel type in which one CCD register is arranged at only one side of the photocell array and in the one CCD register, two pairs of first and second transfer electrodes are provided for each one of the photocells, the first transfer gate electrodes are alternately interconnected to form a C-shaped pattern, so that by interdigitating two C-shaped transfer gate electrodes, each of the two pairs of transfer gate electrodes is connected to one Wiring conductor formed on a corresponding channel stopper region in the photocell array, and therefore, a driving pulse can be applied to the transfer gate electrodes.

The above and other objects, features and advantages of the present invention will be apparent from the following description of preferred embodiments of the invention with reference to the accompanying drawings.

DESCRIPTION OF THE PREFERRED EMBODIMENTS

Figure 5:
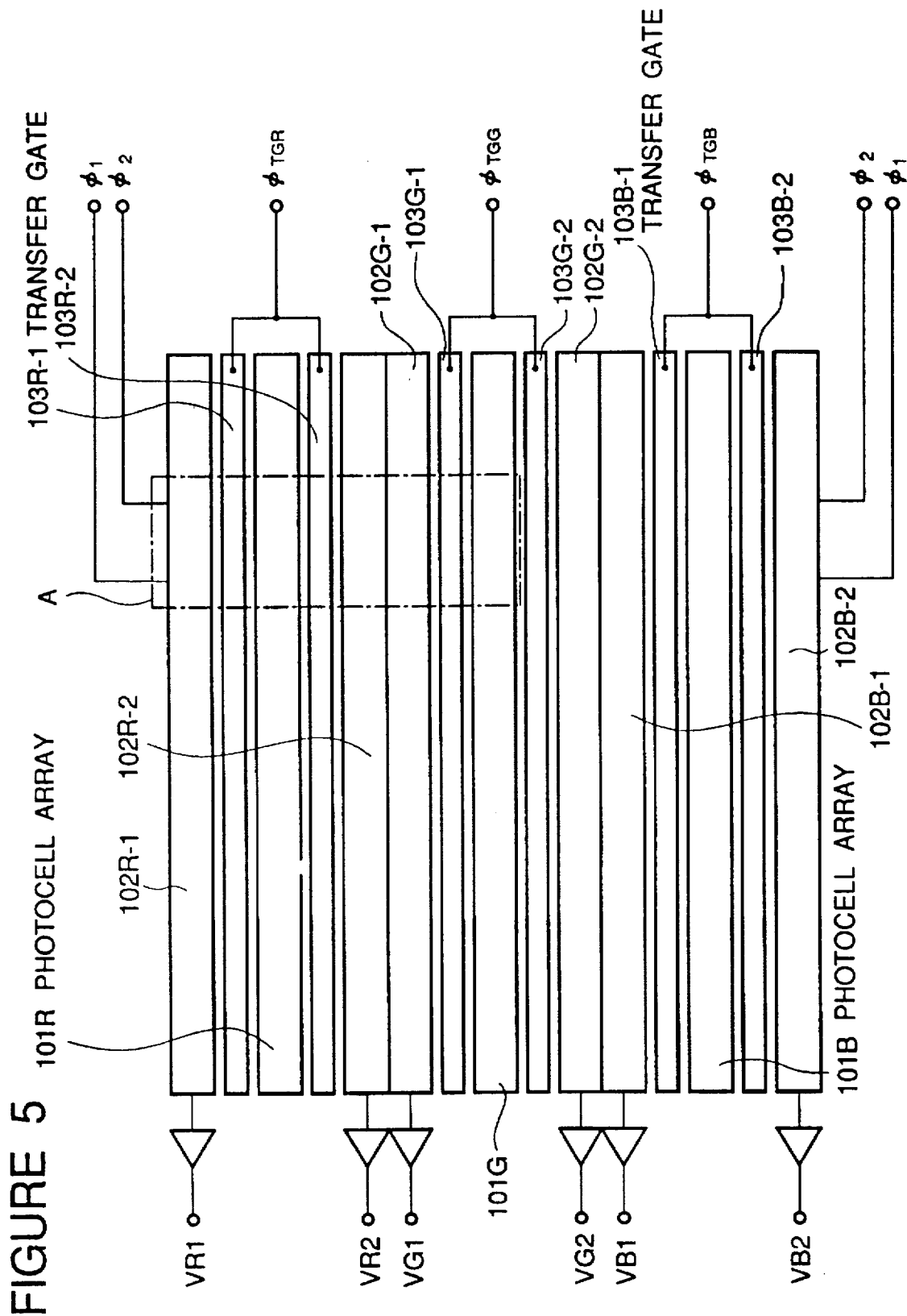
FIG. 5 is a view illustrating an overall structure of a first embodiment of the color linear image sensor apparatus in accordance with the present invention.
Figure 6:
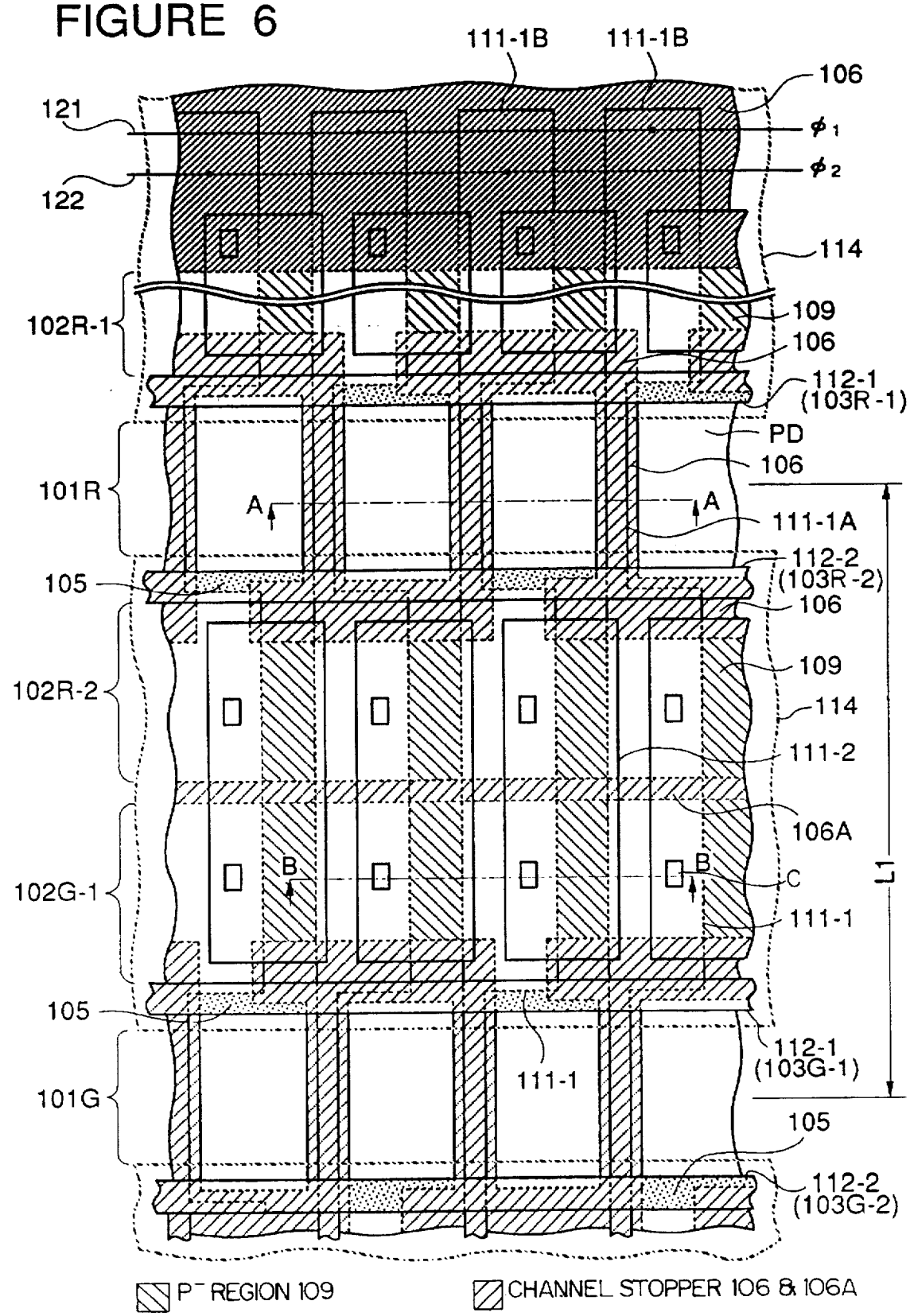
FIG. 6 is a partial layout pattern diagram showing a detail of the portion "A" in FIG. 5.
Figure 7:
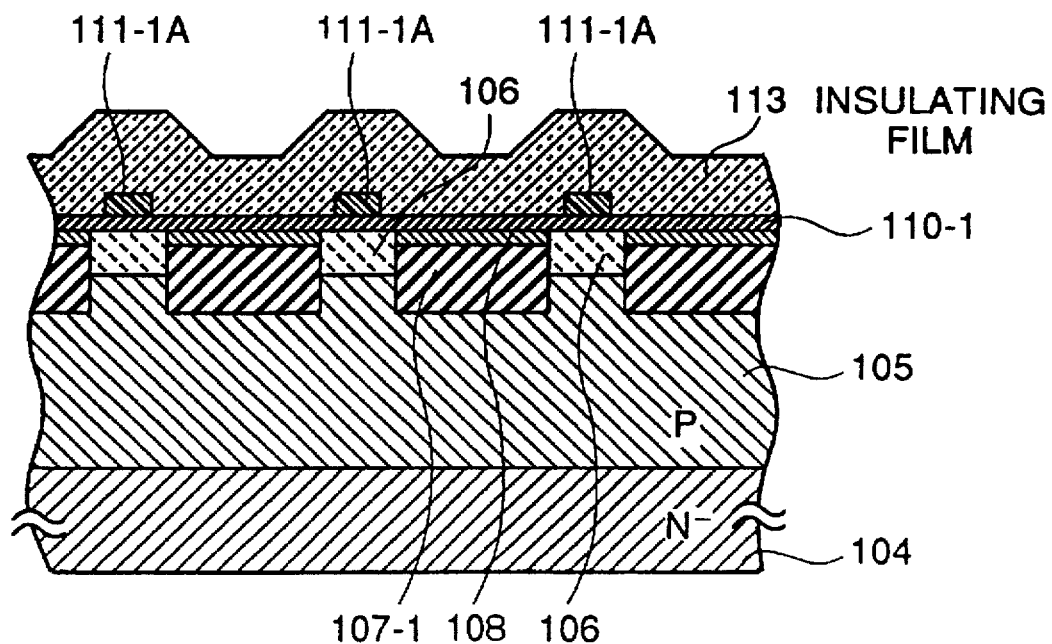
FIG. 7 is a sectional view taken along the ling A—A in FIG. 6.
Figure 8:
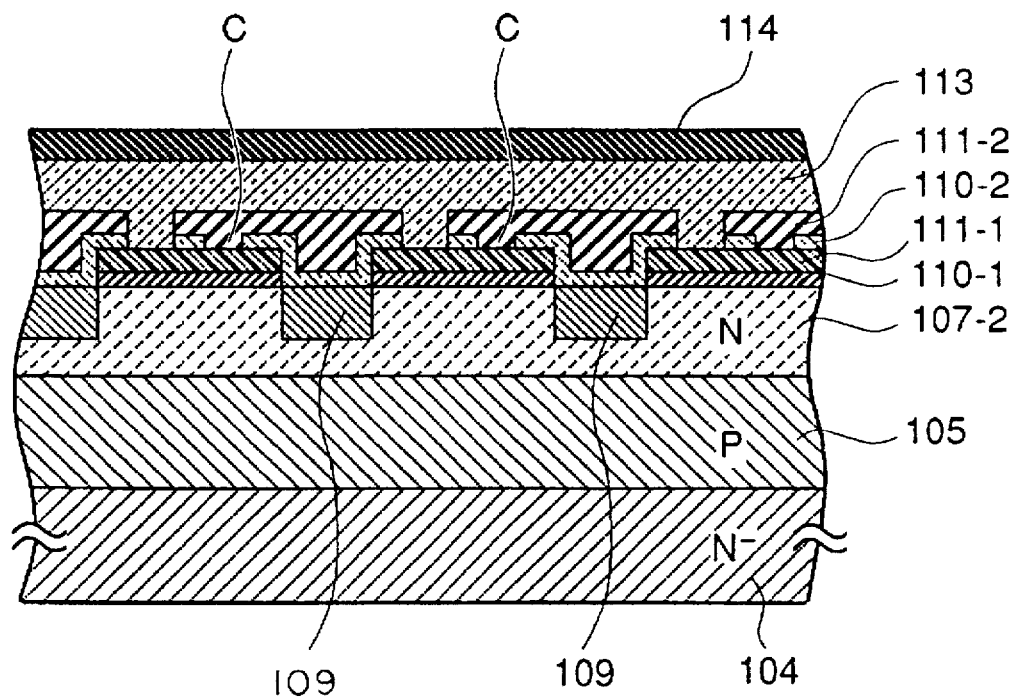
FIG. 8 is a sectional view taken along the ling B—B in FIG. 6.

Referring to FIG. 5, there is diagrammatically shown an overall structure of a first embodiment of the color linear image sensor apparatus in accordance with the present invention. FIG. 6 is a partial layout pattern diagram showing a detail of the portion "A" in FIG. 5. FIG. 7 is a sectional view taken along the ling A—A in FIG. 6, and FIG. 8 is a sectional view taken along the ling B—B in FIG. 6 does not show the insulating gate oxide films 110-1 and 110-2.

On a single semiconductor chip or substrate 104 formed of for example an N$^-$ silicon substrate, there is formed a linear image sensor for red which is composed of a photocell array 101R and a CCD register 102R-1, 102R-2 located at each side of the photocell array 101R through a transfer gate 103R-1, 103R-2, a linear image sensor for green having a similar arrangement (shown by the same Reference Numerals added with "G" in place of "R"), and a linear image sensor for blue having a similar arrangement (shown by the same Reference Numerals added with "B" in place of "R"). In FIG. 6, mutually corresponding elements between the linear image sensor for red, the linear image sensor for green and the linear image sensor for blue are given the same Reference Numerals suffixed with "R", "G" or "B" for distinction among red, green and blue.

Figure 9:
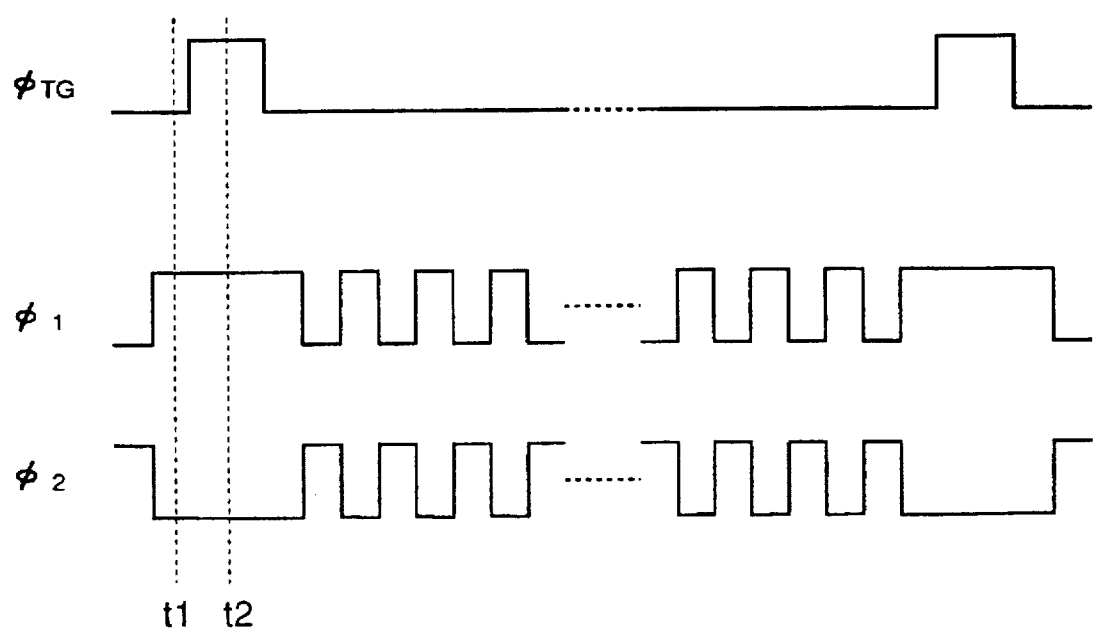
FIG. 9 is a timing chart illustrating one example of the CCD register driving clock pulses $\phi_1$ and $\phi_2$ and the transfer gate pulse $\phi_{TG}$.

Reference Symbols VR1, VR2, . . . designate output signals, and Reference Symbols $\phi_1$ and $\phi_2$ indicate two-phase driving pulses for the CCD registers. Reference Symbols $\phi_{TGR}$, . . . show pulses for driving the transfer gates 103R-1. . . . . One example of $\phi_1$, $\phi_2$ and $\phi_{TG}$ (which is a representative of $\phi_{TGR}$, $\phi_{TGG}$ and $\phi_{TGB}$) is shown in the timing chart of FIG. 9.

As shown in FIG. 6, each of the photocell arrays 101R, . . . is constituted of a number of photodiodes "PD" arranged in a single array. As shown in FIG. 7, each of the photodiodes "PD" includes an N-type region 107-1 formed at a surface portion of a P-type region 105 formed at a principal surface of the N$^-$ silicon substrate 104, and a P$^+$ region 108 formed at a surface of the N-type region 107-1. Adjacent photodiodes are isolated from each other by a P$^+$ channel stopper 106.

As shown in FIG. 8, each of the CCD registers 102R-1, . . . comprises a number of first transfer gate electrodes 111-1 (formed of a first level polysilicon film) each formed through a first gate oxide film 110-1 on an N-type region 107-2, and a number of second transfer gate electrodes 111-2 (formed of a second level polysilicon film) each formed through a second gate oxide film 110-2. As will be apparent from FIG. 8, the second level polysilicon film is basically formed above the first level polysilicon film, and each of the second transfer gate electrodes 111-2 partially overrides the first transfer gate electrodes 111-1 positioned at each side of the second transfer gate electrodes 111-2. Directly under each of the second transfer gate electrodes 111-2, a P⁻ region 109 is formed at the semiconductor substrate.

As shown in FIG. 6, each of the first transfer gate electrodes 111-1 and the second transfer gate electrodes 111-2 is formed to extend over both of the second CCD register (for example, 102R-2) of an upper side linear image sensor and the first CCD register (for example, 102G-1) of a lower side linear image sensor. These two CCD registers are isolated from each other by a channel stopper 106A.

The photodiodes of each photocell array are configured to alternately transfer their electric charge to an upper side CCD register and a lower side CCD register through an area that is not blocked by the channel stopper 106. As illustrated in FIG. 6, each of the photodiodes PD of the photocell array 101R is connected to the upper CCD register 102R-1 or the lower CCD register 102R-2 in an alternating fashion. The P-type region 105 is disposed between the N-type region 107-1 of each of the photodiodes PD and the N-type region 107-2 of the corresponding CCD register in this alternating manner to permit the photodiodes PD to be selectively connected to corresponding CCD registers 102R-1 or 102R-2. Reference Numerals 112-1, 112-2, . . . designate a transfer gate electrode extending along and in parallel with the photocell array and passing above the above mentioned areas not blocked by the channel stopper 106, for the purpose of controlling the transfer of the electric charge from the photocell array to the associated CCD register. These transfer gate electrodes 112-1, 112-2, . . . are formed of the second level polysilicon film.

The mutually corresponding first transfer gate electrodes 111-1 of the respective CCD registers are interconnected through a first level polysilicon film 111-1A which is formed through the first gate oxide film 110-1 on the channel stopper of the photocell array. Each of the first transfer gate electrodes 111-1 has a portion 111-1B extending to the outside of the CCD registers 102R-1 and 102B-2. As shown in FIG. 6, the extending portions 111-1B are alternately connected to wiring conductors 121 for supplying a driving pulse φ₁ and wiring conductors 122 for supplying a driving pulse φ₂. In addition, each of the first transfer gate electrodes 111-1 is connected through a contact hole "C" to the second transfer gate electrode 111-2 positioned at a right side of the first transfer gate electrode 111-1. A light shield is shown by a thick chain line for convenience and given with Reference Numeral 114.

A width of the channel stopper 106A and a width of the channel stopper 106 in each photocell array are each about 2 μm (under the 2 μm rule), and a width of the second level polysilicon film 111-1A is also about 2 μm (the film 111-1A and the channel stopper 106 just below the film 111-1A are depicted to be different in width for convenience of the drawings, but they actually have substantially the same width).

Thus, the color linear image sensor apparatus having the two-phase driven CCD registers has been constructed. The contact holes "C" for interconnecting between the second level polysilicon film and the first level polysilicon film are formed within a territory of the CCD registers, but not on the channel stopper 106A. Accordingly, differently from the conventional example shown in FIG. 2, it is no longer necessary to ensure a large width for the channel stopper 106A. As a result, the distance "L1" between each pair of adjacent photocell arrays can be made shorter than the distance "L" (=140 μm) of the conventional example, about 10 μm. However, the size of the pixels does not change.

Now, explanation will be made about why the contact holes "C1" and "C2" had to be provided on the channel stopper 6A in the conventional example (FIG. 2), and about why the contact holes "C" can be provided within the territory of the CCD register in the embodiment of the present invention (FIG. 6).

Figure 1:
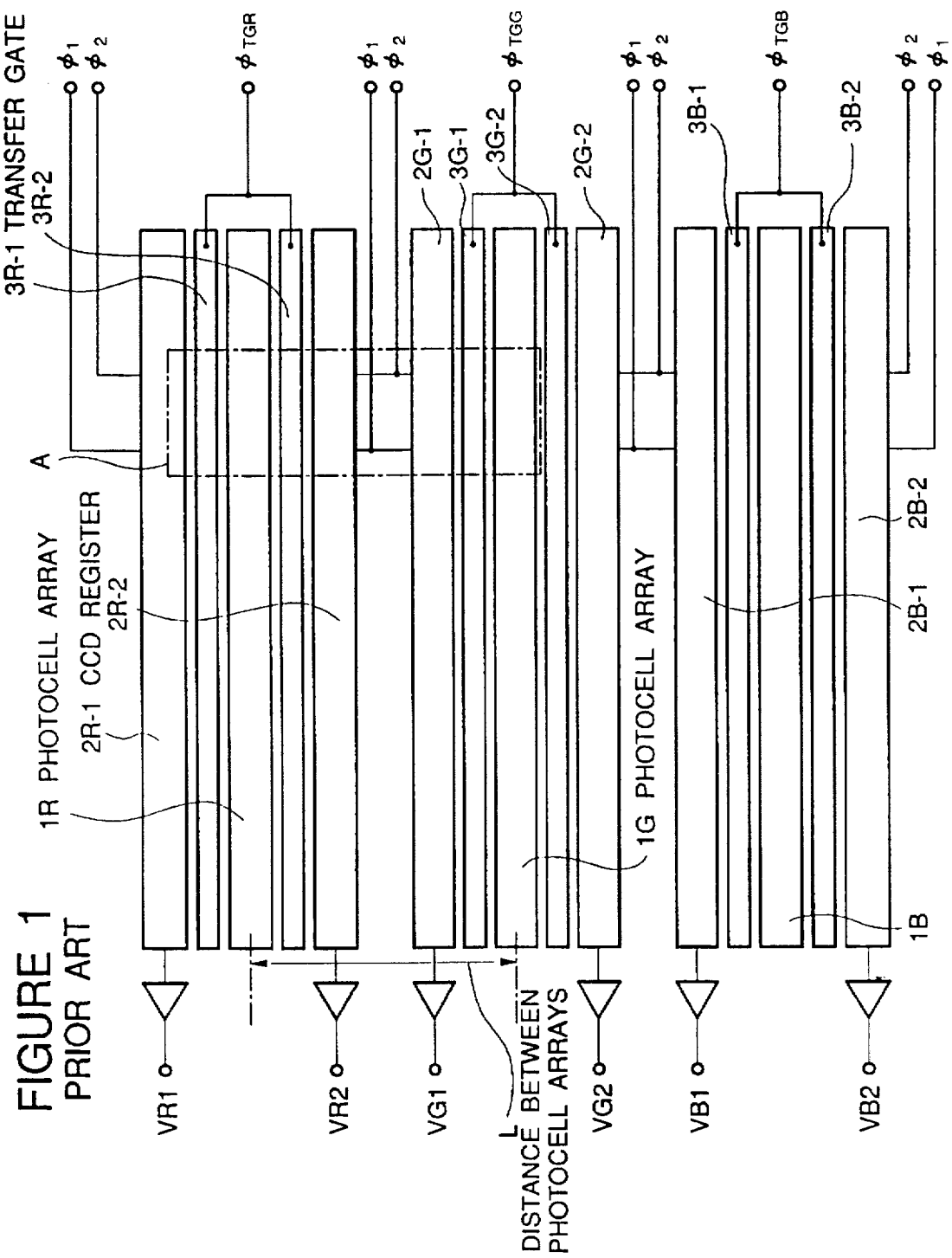
FIG. 1 is a view illustrating an overall structure of one example of the conventional color linear image sensor apparatus.
Figure 2:
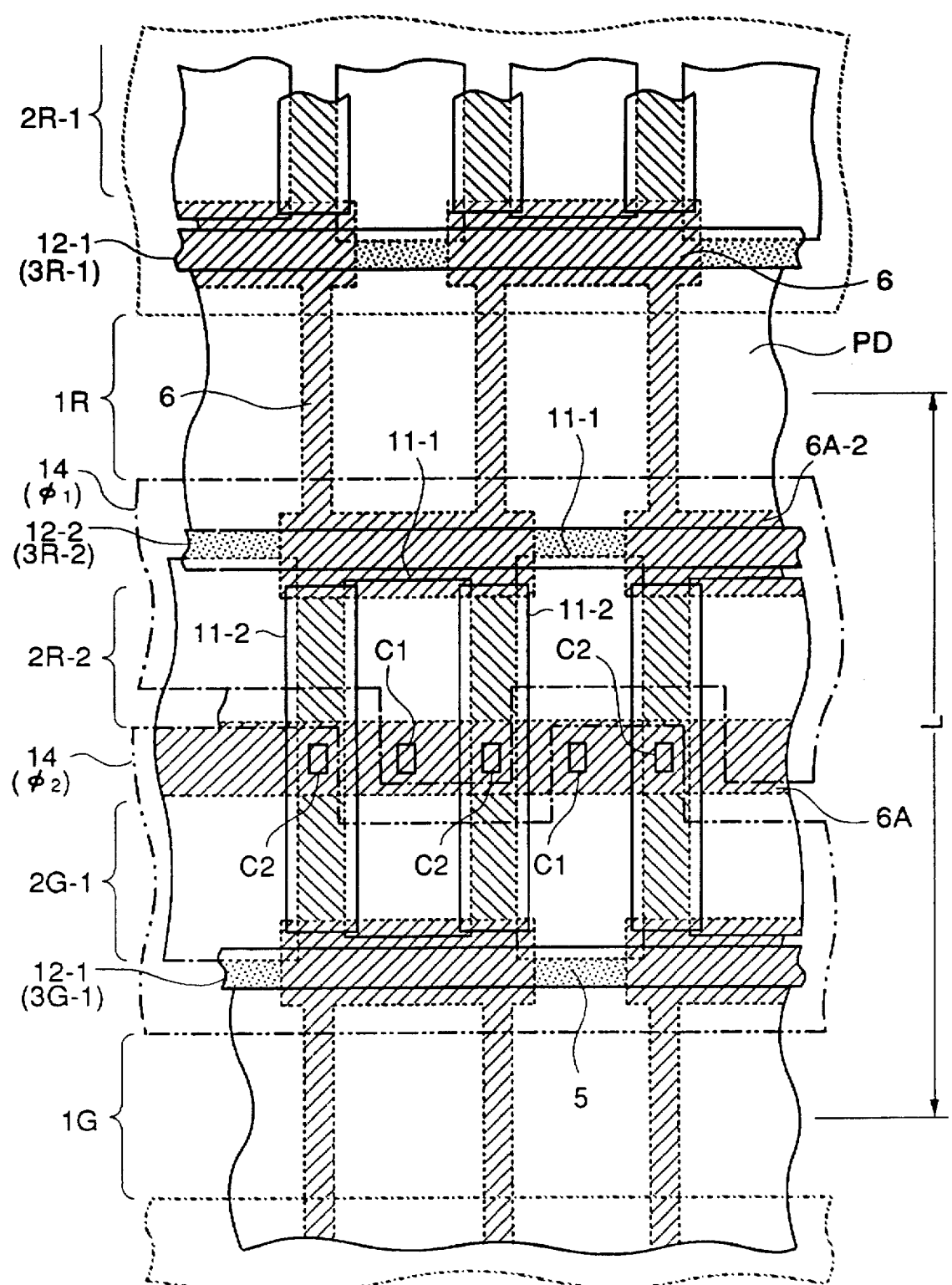
FIG. 2 is a partial layout pattern diagram showing a detail of the portion "A" in FIG. 1.
Figure 3:
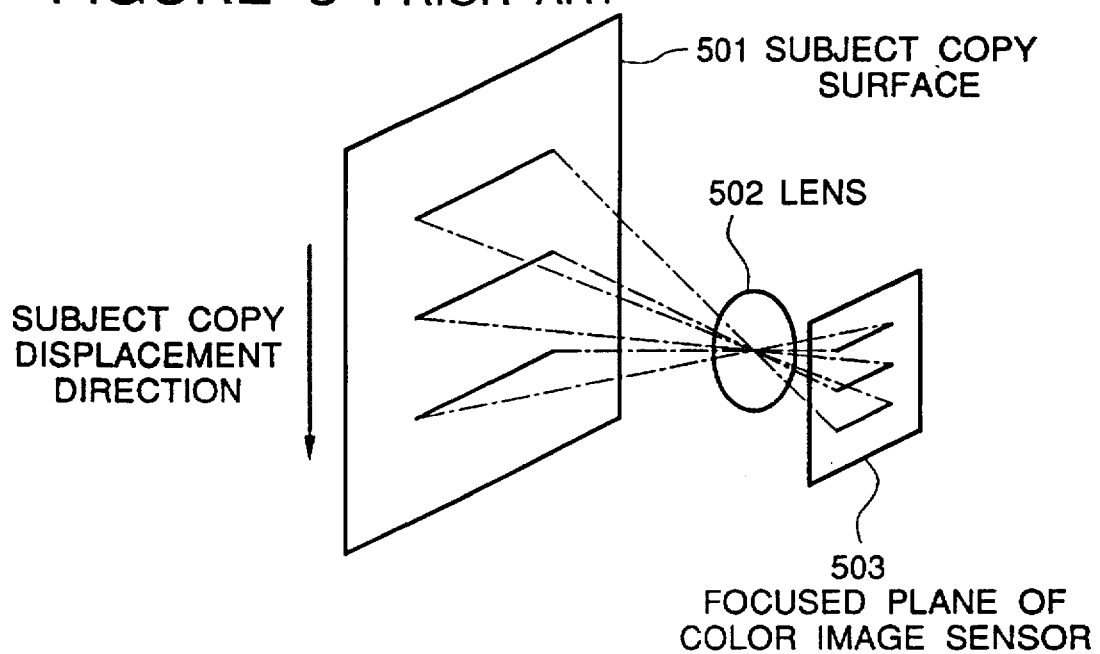
FIG. 3 is an optical path diagram used for illustrating the problem in the case of using the color linear image sensor.
Figure 4:
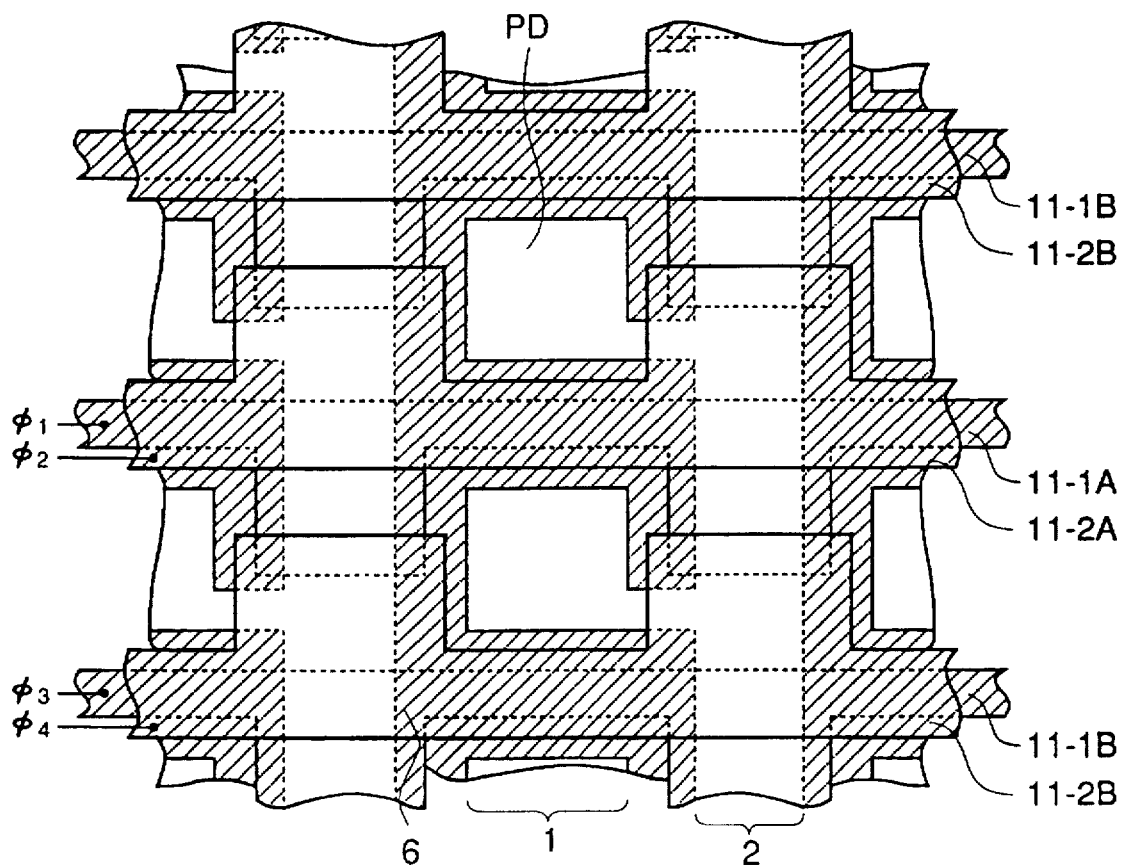
FIG. 4 is a view illustrating another example of the conventional color linear image sensor apparatus.

In FIG. 2, the clock signal wiring conductors 14 are connected to the first level polysilicon film and the second level polysilicon film through the contact holes "C1" and "C2". The clock signal wiring conductors 14 are ordinarily formed of a metal film such as an aluminum film in order to reduce a wiring resistance. Generally, in a connection portion between a metal and a polysilicon film, the metal permeates into the polysilicon film. Therefor the polysilicon film in contact with the connection portion, and in the neighborhood thereof, changes in its film quality. Accordingly, to ensure that an adverse influence does not exert on the characteristics of the sensor even if the film quality in the contact hole and its neighborhood changes the P-type channel stopper is provided under the contact holes. In other words, the polysilicon film and the metal have to be contacted to each other on the channel stopper.

In the embodiment of the present invention (FIG. 6), since the first polysilicon film and the second polysilicon film, which are the same in nature, are connected to each other through the contact hole, because no change of film quality occurs. Film quality is constant because there never occurs a situation in which the quality of only the film under the contact holes becomes different. As a result the materials of the first and second polysilicon films are connected to each other in the embodiment of the present invention and there is no film quality problem even though the contact portions are formed within the territory of the CCD registers.

Figure 10:
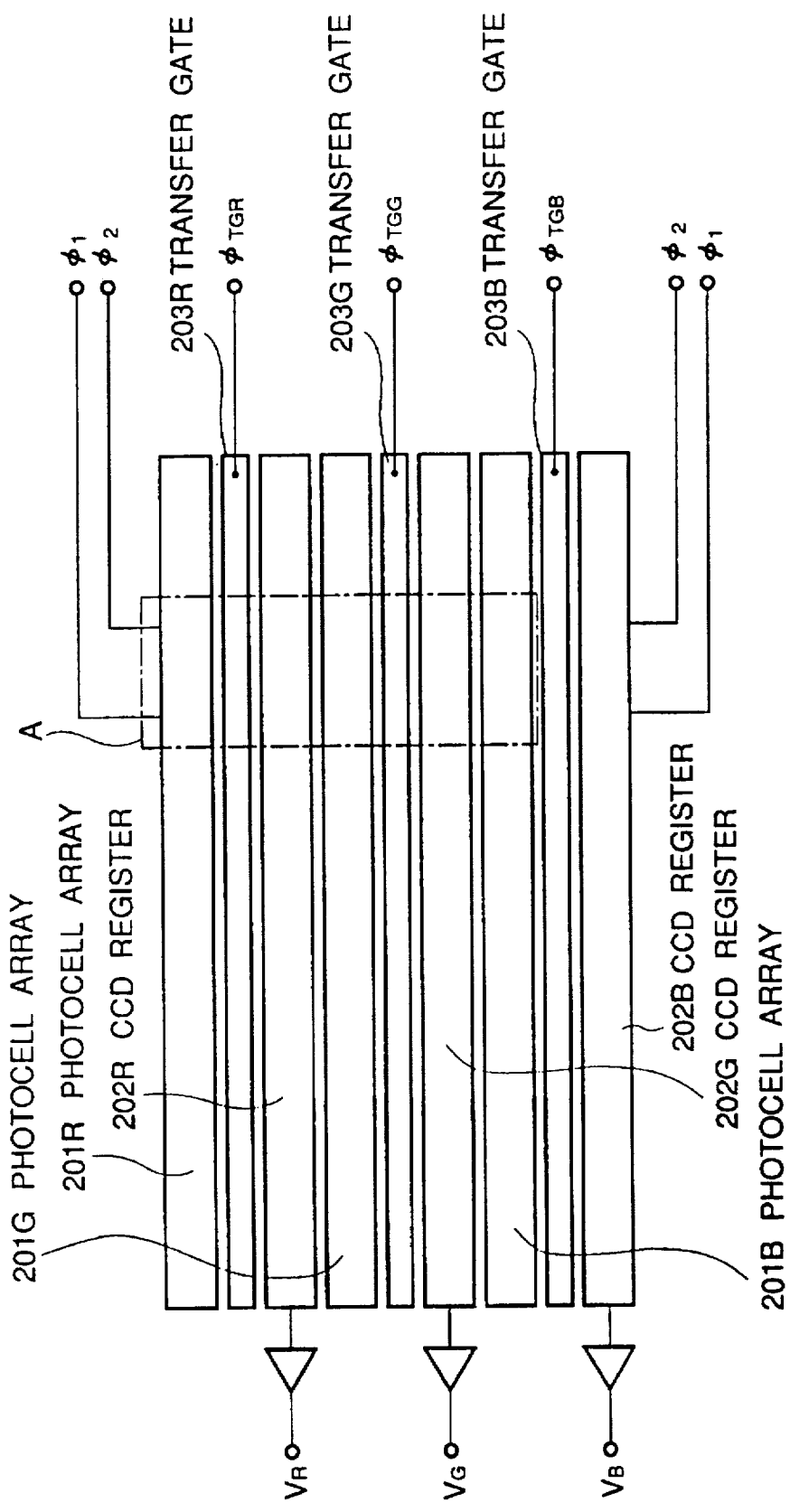
FIG. 10 is a view illustrating an overall structure of a second embodiment of the color linear image sensor apparatus in accordance with the present invention.
Figure 11:
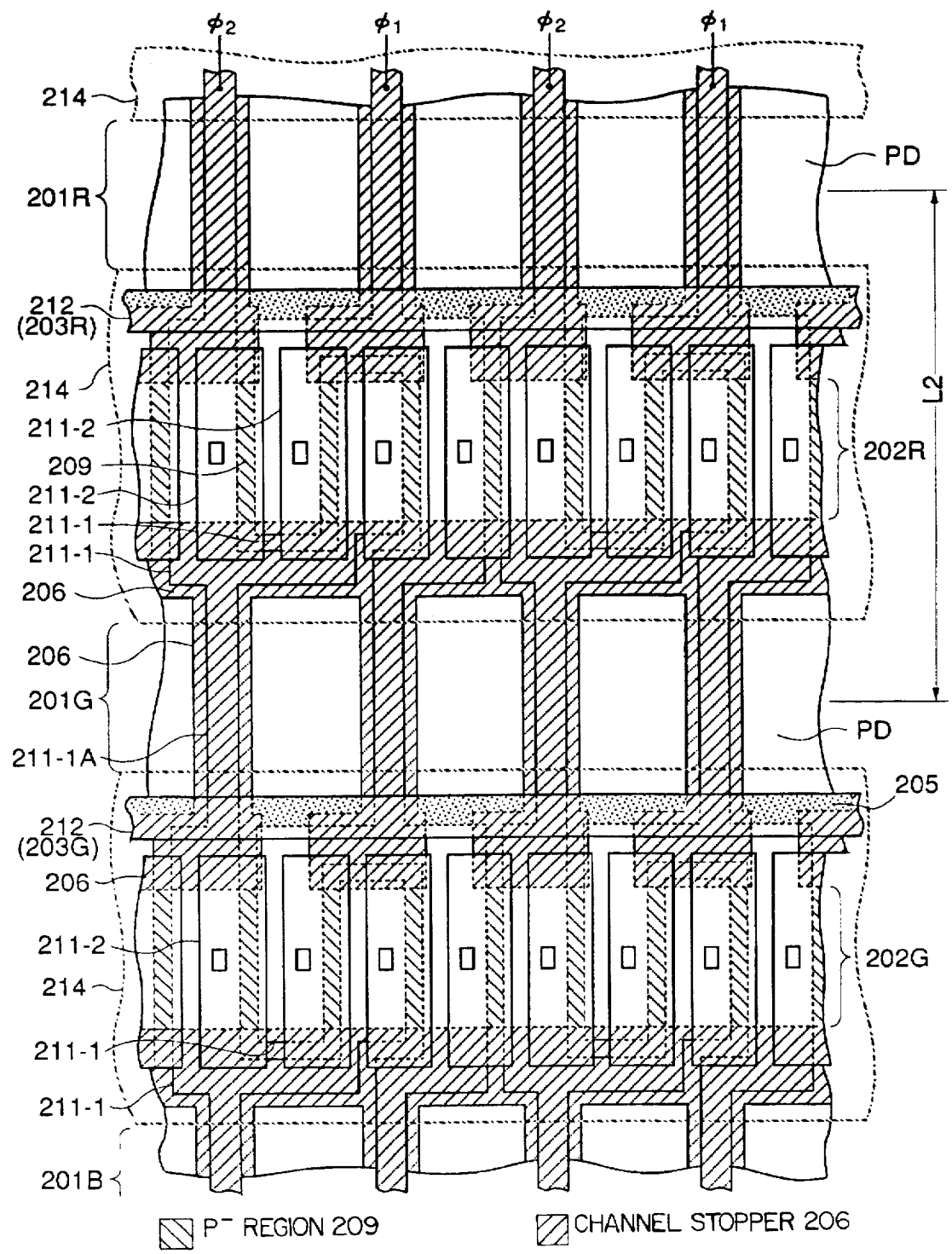
FIG. 11 is a partial layout pattern diagram showing a detail of the portion "A" in FIG. 10.

Now, a second embodiment of the color linear image sensor, apparatus in accordance with the present invention will be explained with reference to FIG. 10 showing an overall structure of the second embodiment and FIG. 11 illustrating the detail of a portion "A" in FIG. 10.

In the second embodiment is only one side of each of photocell arrays 201R, . . . , has register 202R, . . . formed through a transfer gate 203R, . . . (single-channel type). In the first embodiment two CCD registers are located between each pair of adjacent photocell arrays. In the second embodiment only one CCD register is provided between each pair of adjacent photocell arrays. This allows embodiment, the distance between each pair of adjacent photocell arrays can to be further shortened. However, this arrangement needs that the pitch of the CCD register must be made half of the pitch of the double-channel type used in the first embodiment. Therefore, supplying the driving voltage to the CCD registers becomes more difficult than in the first embodiment. However, this difficulty is overcome in the following manner.

Figure 12:
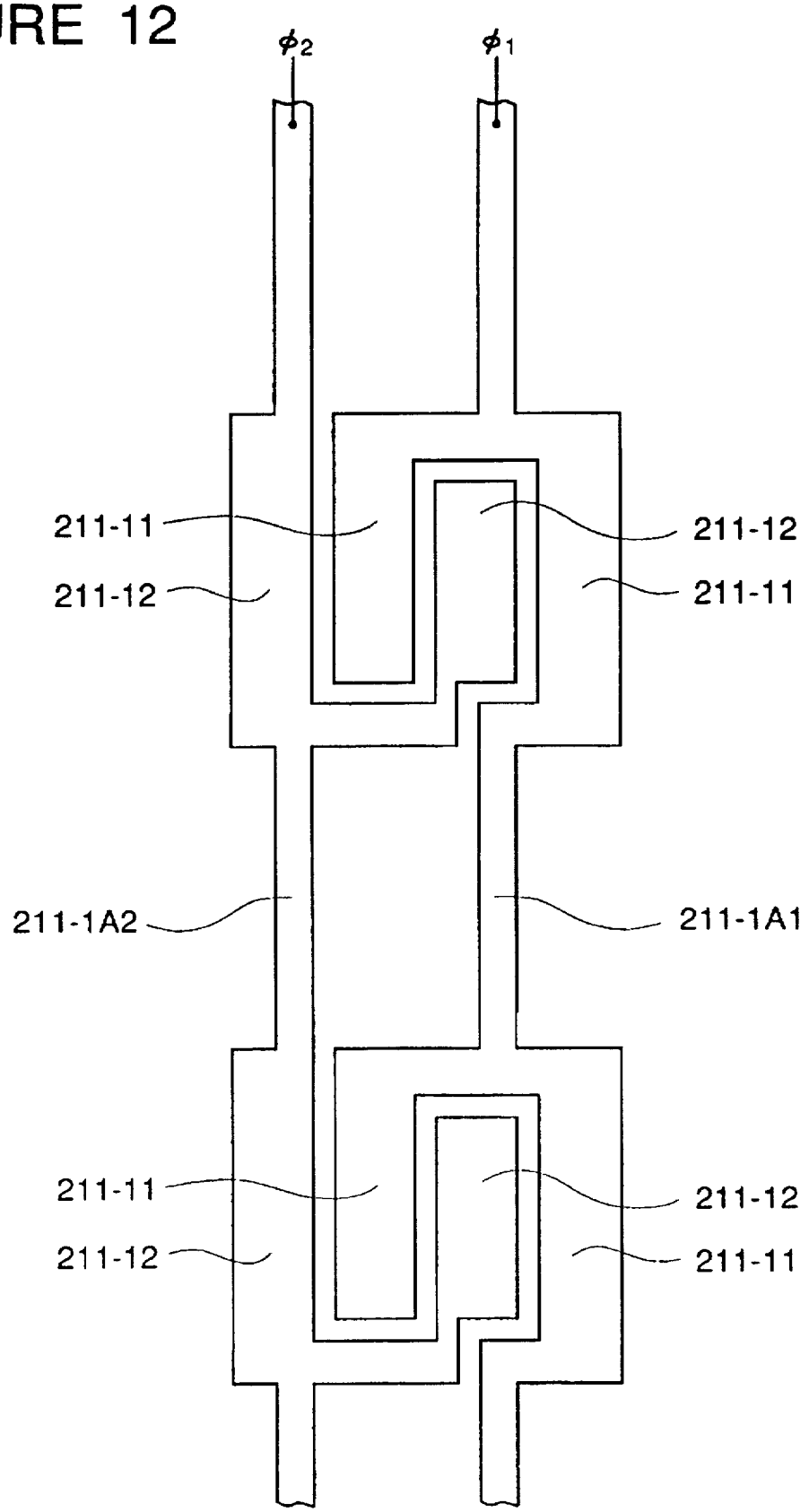
FIG. 12 is a layout pattern diagram of the first transfer gate electrodes associated with a pair of adjacent photodiodes shown in FIG. 11.

In the case of the single-channel type, two pairs of transfer gate electrodes (first transfer gates 211-1 and second transfer gates 211-2) are provided for each photocell (photodiode PD) of the photocell arrays. As shown in FIG. 11, two first transfer gate electrodes 211-1 cover, through a first gate oxide film (not shown), a coupled portion between the photodiode PD and the CCD register 202R, . . . . As will be more clearly understood from FIG. 12, one 211-11 of the two first transfer gate electrodes 211-11 for each pair of photodiodes is coupled to each other so to form a C-shaped pattern, and is also coupled to a first level polysilicon film 211-1A1 extending over the channel stopper region 206 in the photocell array 201R, so that a driving clock $\phi_1$ is applied to the first level polysilicon film 211-1A1. Similarly, the other of the two first transfer gate electrode 211-12 for each of one pair of photodiodes is connected to each other so as to form a C-shaped pattern, and also coupled to a first level polysilicon film 211-A2 extending over a different channel stopper region in the photocell array, so that a driving clock $\phi_2$ is applied to the first level polysilicon film 211-A2. Thus, the wiring conductors, which are supplied with the driving clocks $\phi_1$ and $\phi_2$, are formed of the first level polysilicon film, and alternately located on the channel stopper regions. Each first transfer gate electrode 211-1 is connected through a contact hole "C" to the second transfer gate electrode 211-2 which is paired with the first transfer gate electrode 211-1.

Accordingly, a single Wiring conductor of the first level polysilicon film formed on each channel stopper region can be branched into two wiring conductors within the territory of the CCD register.

With the above mentioned arrangement, it is possible to realize the structure in which only one CCD register array is provided for one photocell array as shown in FIG. 10. Therefore, a distance "$L_2$" between each pair of adjacent photocell arrays can be made shorter than the first embodiment by a width of at least one CCD register array.

As mentioned above, in the two-phase driven color linear image sensor apparatus having a plurality of linear image sensors formed in parallel to each other on a semiconductor chip, the present invention is characterized in that first transfer gate electrodes of a CCD register associated with each linear image sensor are mutually coupled by a conducting film passing over a channel stopper of a photocell array, and supplied with a corresponding driving clock pulse, and second transfer gate electrodes of the CCD register associated with each linear image sensor are connected to corresponding first transfer gate electrodes through a contact hole formed in a gate oxide film formed under the second transfer gate electrode. With this configuration, the width of the channel stopper between adjacent CCD registers can be reduced to a minimum size required for isolation. Accordingly, it has become possible to shorten the distance between adjacent photocell arrays. Therefore, it is possible to correspondingly decrease the memory capacity of an external memory required to obtain a color image.

The invention has thus been shown and described with reference to the specific embodiments. However, it should be noted that the present invention is in no way limited to the details of the illustrated structures but changes and modifications may be made within the scope of the appended claims.

I claim:

1. A color linear image sensor apparatus including three linear image sensors which are integrated in parallel to each other on the same semiconductor chip, each of said linear image sensors having a color sensitivity different from each other, each of the linear image sensors including:
a photocell array composed of a plurality of photocells arranged in the form of a single array and channel stoppers which isolate adjacent photocells of each of said linear image sensors from each other;
a CCD register for receiving an electric charge from said photocell array and transferring the received electric charge therethrough, the CCD register being composed of a plurality of first and second transfer gate electrodes alternately connected to a plurality of wiring conductors, said first transfer gate electrodes being formed of a first level polysilicon film, said second transfer gate electrodes being formed of a second level polysilicon film formed above the first level polysilicon film;
an insulating film formed above said first and second transfer gate electrodes and said channel stoppers;
each of said wiring conductors interconnecting the corresponding first transfer gate electrodes of each of said three linear image sensors, each of said wiring conductors being formed through said insulating film, and each of said wiring conductors being formed of the first level polysilicon film, thereby forming extensions of said first transfer gate electrodes above said channel stoppers, said second transfer gate electrodes having only partial extensions above said channel stoppers, interconnecting said second transfer gate electrodes of said three linear image sensors; and
means for connecting each of said second transfer gate electrodes to a corresponding one of said first transfer gate electrodes.

2. A color linear image sensor apparatus as claimed in claim 1, wherein said linear image sensors are of a dual channel type in which:
each photocell array has a first and a second side opposite from each other,
a first CCD register is arranged at the first side of each photocell array, and
a second CCD register is arranged at the second opposite side of each photocell array,
each first and second CCD register having one first transfer gate electrode and one second transfer gate electrode provided for each photocell, said first transfer gate electrodes of the first and second CCD registers being connected by one wiring conductor formed on each channel stopper in each photocell array.

* * * * *